(12) United States Patent  
Liu

(10) Patent No.: US 11,988,704 B2  
(45) Date of Patent: May 21, 2024

(54) TEST CIRCUITS AND SEMICONDUCTOR TEST METHODS

(71) Applicant: CHANGXIN MEMORY TECHNOLOGIES, INC., Hefei (CN)

(72) Inventor: ChihCheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 155 days.

(21) Appl. No.: 17/431,232

(22) PCT Filed: Mar. 9, 2021

(86) PCT No.: PCT/CN2021/079649  
§ 371 (c)(1),  
(2) Date: Aug. 16, 2021

(87) PCT Pub. No.: WO2021/196990  
PCT Pub. Date: Oct. 7, 2021

(65) Prior Publication Data  
US 2023/0057528 A1 Feb. 23, 2023

(30) Foreign Application Priority Data  
Apr. 3, 2020 (CN) .......................... 202010259653.7

(51) Int. Cl.  
*G01R 31/14* (2006.01)  
*G01R 31/26* (2020.01)

(52) U.S. Cl.  
CPC ......... *G01R 31/14* (2013.01); *G01R 31/2642* (2013.01)

(58) Field of Classification Search  
CPC .... G01R 31/14; G01R 31/2642; G01R 31/12; G01R 31/26; G01R 31/2607; H01L 22/00  
See application file for complete search history.

(56) References Cited

U.S. PATENT DOCUMENTS 10,475,677 B2 11/2019 Shen et al.  
11,187,740 B2 11/2021 Yang et al.  
(Continued)

FOREIGN PATENT DOCUMENTS

CN 1387245 A 12/2002  
CN 2916724 Y 6/2007  
(Continued)

OTHER PUBLICATIONS

English translation of CN-101702005-A (Year: 2010).*  
(Continued)

*Primary Examiner* — Giovanni Astacio-Oquendo  
*Assistant Examiner* — Haidong Zhang  
(74) *Attorney, Agent, or Firm* — Cooper Legal Group, LLC

(57) ABSTRACT

The present application relates to a test circuit, comprising: M test units, each test unit having a first terminal and a second terminal, a first terminal of each test unit being connected to a power wire, a second terminal of each test unit being connected to a ground wire, M being a positive integer; each test unit comprises a TDDB test component, a switch, and a control circuit; the TDDB test component has a first equivalent resistance before being broken down, the TDDB test component has a second equivalent resistance after being broken down, and the first equivalent resistance is greater than the second equivalent resistance.

14 Claims, 2 Drawing Sheets

(56) References Cited

U.S. PATENT DOCUMENTS

| | | | | |
|---|---|---|---|---|
| 2011/0279142 | A1* | 11/2011 | Cho | G01R 31/261 |
| | | | | 324/762.01 |
| 2013/0314119 | A1 | 11/2013 | Chen et al. | |
| 2016/0061880 | A1 | 3/2016 | Uppal | |
| 2019/0067056 | A1* | 2/2019 | Shen | G01R 3/00 |
| 2020/0141995 | A1* | 5/2020 | Yang | G01R 31/2858 |

FOREIGN PATENT DOCUMENTS

| | | | |
|---|---|---|---|
| CN | 101702005 A | * | 5/2010 |
| CN | 101728293 A | | 6/2010 |
| CN | 103852701 A | | 6/2014 |
| CN | 105470240 A | | 4/2016 |
| CN | 106229953 A | | 12/2016 |
| CN | 106291276 A | | 1/2017 |
| CN | 106409817 A | | 2/2017 |
| CN | 107039299 A | | 8/2017 |
| CN | 109324277 A | | 2/2019 |
| CN | 109427603 A | | 3/2019 |
| CN | 109754736 A | | 5/2019 |
| CN | 110140200 A | | 8/2019 |
| CN | 210110351 U | | 2/2020 |
| CN | 111812472 A | | 10/2020 |
| JP | 0755875 A | | 3/1995 |
| JP | 09213760 A | | 8/1997 |
| TW | 202018315 A | | 5/2020 |

OTHER PUBLICATIONS

First Office Action cited in CN 202010259653.7 mailed Jan. 27, 2022, 22 pages.

"Tenth Five Year Plan of General Higher Education (Higher Vocational Education)", Dec. 31, 2003, ISBN: 7-04-013174-9.

International Search Report cited in PCT/CN2021/079649 mailed Apr. 3, 2020, 11 pages.

* cited by examiner

TEST CIRCUITS AND SEMICONDUCTOR TEST METHODS

CROSS-REFERENCE TO RELATED APPLICATIONS

The present application claims the priority to Chinese Patent Application 202010259653.7, titled "TEST CIRCUITS AND SEMICONDUCTOR TEST METHODS", filed to the State Intellectual Property Office of People's Republic of China on Apr. 3, 2020, which is incorporated herein by reference in its entirety.

TECHNICAL FIELD

The present application relates to the technical field of semiconductors, and in particular, to a test circuit and a semiconductor test method.

BACKGROUND OF THE PRESENT INVENTION

TDDB (Time Dependent Dielectric Breakdown) is an important method to evaluate the quality of dielectrics. In conventional TDDB test structures, a constant voltage is applied to one end of the sample to be tested and the other end thereof is grounded. The current flowing through the sample is continuously monitored. At a certain moment of time, the sample to be tested breaks down and the circuit is short-circuited. At this time, the measuring machine will measure a sharp high current, and will stop the test after measuring the high current. Obviously, the TDDB test is a time-consuming test. The higher the constant voltage applied to the sample to be tested is, the shorter the test time is. However, high voltage may lead to the oxide be burned, due to unreasonable prediction of the gate oxide lifetime and unstable and different mechanisms.

SUMMARY OF THE PRESENT INVENTION

In a first aspect of the present application, a test circuit is provided, comprising:
  M test units, each test unit having a first terminal and a second terminal, the first terminal of each test unit being connected to a power wire, the second terminal of each test unit being connected to a ground wire, M being a positive integer; and
  each test unit comprises a TDDB test component, a switch, and a control circuit, wherein a first terminal of the TDDB test component is the first terminal of the test unit and a second terminal of the TDDB test component is connected to a first terminal of the switch, a second terminal of the switch is the second terminal of the test unit, and the first terminal of the switch is connected to a control terminal of the switch through the control circuit;
  the TDDB test component has a first equivalent resistance before being broken down, the TDDB test component has a second equivalent resistance after being broken down, and the first equivalent resistance is greater than the second equivalent resistance.

In a second aspect of the present application, a semiconductor test method is provided, comprising:
  applying a same test voltage to each TDDB test component in a test circuit according to any one of claims 1 to 12; and
  recording a breakdown lifetime of each TDDB test component.

In a third aspect of the present application, a semiconductor test method is provided, comprising:
  applying a same test voltage to each TDDB test component in a test circuit according to claim 12;
  recording a breakdown lifetime of each TDDB test component, and recording time when each voltage collection device collects a target voltage; and
  determining the breakdown lifetime of each TDDB test component, based on a position of each voltage collection device, the time when each voltage collection device collects the target voltage, and recorded breakdown lifetime of each TDDB test component.

In the technical solution of the present application, the TDDB test components are tested at the same voltage and at the same time. Once one of the TDDB test units is broken down, the control circuit and switch will turn off the branch where the TDDB test unit is located, to avoid the occurrence of the short-circuit, without affecting the subsequent continued testing of other TDDB test units. Therefore, multiple TDDB test units can be tested at the same time, which greatly shortens the test time.

BRIEF DESCRIPTION OF THE DRAWINGS

In order to better describe and illustrate the embodiments of the present application, reference may be made to one or more drawings. However, the additional details or examples used to describe the drawings should not be considered as any limitation to the concept of the present application or any one of the currently described embodiments or preferred implementations.

DETAILED DESCRIPTION OF THE PRESENT INVENTION

Figure 1:
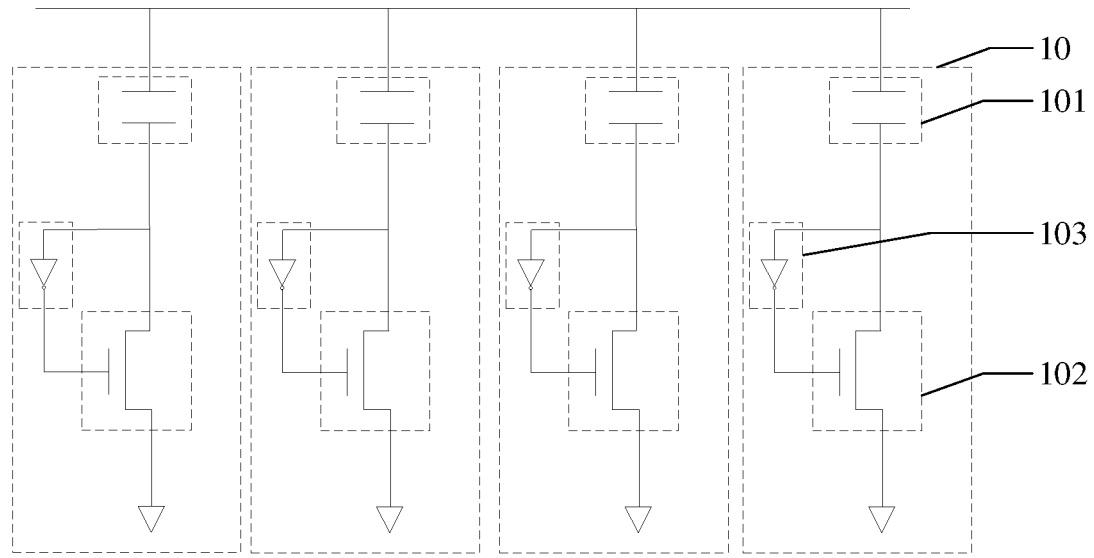
FIG. 1 is a schematic structure diagram of a test circuit according to an embodiment of the present application.

In order to facilitate the understanding of the present application, the present application will be described more fully below with reference to the relevant drawings. Preferred embodiments of the present application are shown in the drawings. However, the present application may be implemented in many different forms and is not limited to the embodiments described herein. On the contrary, these embodiments are provided to make the disclosure of the present application more thorough and comprehensive.

Unless otherwise defined, all technical and scientific terms used herein have the same meaning as commonly understood by a person of ordinary skill in the art to which the present application belongs. Here, terms used in the description of the present application are merely intended to describe specific embodiments, rather than limiting the present application. As used herein, the term "and/or" includes any or all of one or more associated items listed here or combinations thereof.

In the description of the present application, it should be understood that orientations or location relationships indicated by terms such as "upper", "lower", "vertical", "horizontal", "inner", "outer" are the directions and the location relationships illustrated on the basis of the drawings, and used just for convenience of describing the present application and simplifying the description, rather than indicating or implying that the devices or components must have a specific orientation and be constructed and operated in the specific orientation, and therefore shall not be considered as any limitations to the present application.

In order to shorten the test time, as shown in FIG. 1, the present application provides a test circuit comprising M test units 10, each test unit 10 having a first terminal and a second terminal, a first terminal of each test unit 10 being connected to a power wire and applied with a same test voltage, a second terminal of each test unit 10 being grounded, M being a positive integer;

each test unit 10 comprises a TDDB test component 101, a switch 102, and a control circuit, wherein a first terminal of the TDDB test component 101 is the first terminal of the test unit 10 and a second terminal of the TDDB test component 101 is connected to a first terminal of the switch 102, a second terminal of the switch 102 is the second terminal of the test unit 10, and the first terminal of the switch 102 is connected to the control terminal of the switch 102 through the control circuit; and the TDDB test component 101 has a first equivalent resistance before being broken down, the TDDB test component 101 has a second equivalent resistance after being broken down, and the first equivalent resistance is greater than the second equivalent resistance.

In an optional embodiment, the ratio of the first equivalent resistance to the second equivalent resistance is greater than 100. Specifically, the ratio of the first equivalent resistance to the second equivalent resistance may be 100, 110, 150, etc. However, the above numerical values are only provided as an example. In actual embodiments, the ratio of the first equivalent resistance to the second equivalent resistance is not limited to the above numerical values.

In an optional embodiment, the TDDB test component 101 has a dielectric layer, and the area of the dielectric layer is greater than 1 $\mu m^2$ and less than or equal to 1,000,000 $\mu m^2$. The area of the dielectric layer may be 1 $\mu m^2$, 100 $\mu m^2$, 1000 $\mu m^2$, or 1,000,000 $\mu m^2$, etc. However, the above numerical values are only provided as an example. In actual embodiments, the width of a second doped region 12 of the second conductivity type is not limited to the above numerical values. In an optional embodiment, the material of the dielectric layer is made of silicon dioxide.

In an optional embodiment, M is greater than or equal to 2. It may be 2, 3, or 8, etc. However, the above numerical values are only provided as an example. In actual embodiments, the value of M is not limited to the above numerical values. The material of the dielectric layer in each TDDB test component is the same. In an example, the areas of the dielectric layers of the TDDB test components 101 of the M test units 10 may be the same. In another example, the areas of the dielectric layers of the M TDDB test components 101 may be not exactly the same. Specifically, the areas of the dielectric layers in some TDDB test components 101 may be the same, or the areas of the dielectric layers in the TDDB test components 101 may be different. More specifically, the areas of the dielectric layers of the TDDB test components 101 in the M test units 10 may be in an arithmetic sequence or a geometric sequence. By setting the areas of the dielectric layers of the TDDB test components 101 to be different, multiple different TDDB test components 101 may be tested in sequence, that is, the breakdown lifetime of the TDDB test components 101 with dielectric layers of different areas may be tested at the same time. This can shorten the test time and improve the test efficiency.

In another optional embodiment, M is greater than or equal to 2. It may be 2, 3, or 8, etc. However, the above numerical values are only provided as an example. In actual embodiments, the value of M is not limited to the above numerical values. The areas of the dielectric layers of the TDDB test components 101 in the test units 10 are the same, but the materials of the dielectric layers of the TDDB test components 101 in the M test units 10 are not exactly the same. Specifically, the materials of the dielectric layers of some TDDB test components 101 may be the same, or the materials of the TDDB test components 101 may be different. By setting the TDDB test components 101 so that the areas of the dielectric layers are the same and the materials of the dielectric layers are not exactly the same, multiple different TDDB test components 101 may be tested in sequence, that is, the breakdown lifetime of the TDDB test components 101 with dielectric layers of the same areas and different materials may be tested at the same time. This can shorten the test time and improve the test efficiency.

In an optional embodiment, the switch 102 comprises an NMOS transistor, the drain of the NMOS transistor is electrically connected to the second terminal of the TDDB test component 101, and the source of the NMOS transistor is grounded.

In other optional embodiments, the control circuit comprises an inverter, the input of the inverter is electrically connected to the second terminal of the TDDB test component 101, and an another terminal is electrically connected to the gate of the NMOS transistor. Therefore, when the TDDB test component 101 is not broken down, the second terminal of the TDDB test component 101 is at a low level, that is, the input terminal of the inverter is at a low level, and the output terminal of the inverter is at a high level, that is, a high level is applied to the gate of the NMOS transistor. At this time, the NMOS transistor is turned on, and the branch where the TDDB test component 101 is located is operating normally. When the TDDB test component 101 is broken down, the second terminal of the TDDB test component 101 is at a high level, and the output terminal of the inverter is at a high level, that is, a low level is applied to the gate of the NMOS transistor. At this time, the NMOS transistor is turned off, that is, the switch 102 is turned off, and the branch where the TDDB test component 101 is located is disconnected, which will not cause the branch to be short-circuited. In this case, other test units 10 can still be tested normally. In the test circuit, the test units 10 may be tested at the same time, and the branch may be automatically disconnected when the TDDB test component 101 in a test unit 10 is broken down, so that the branch will not be short-circuited to affect the normal testing of other test units 10.

Figure 2:
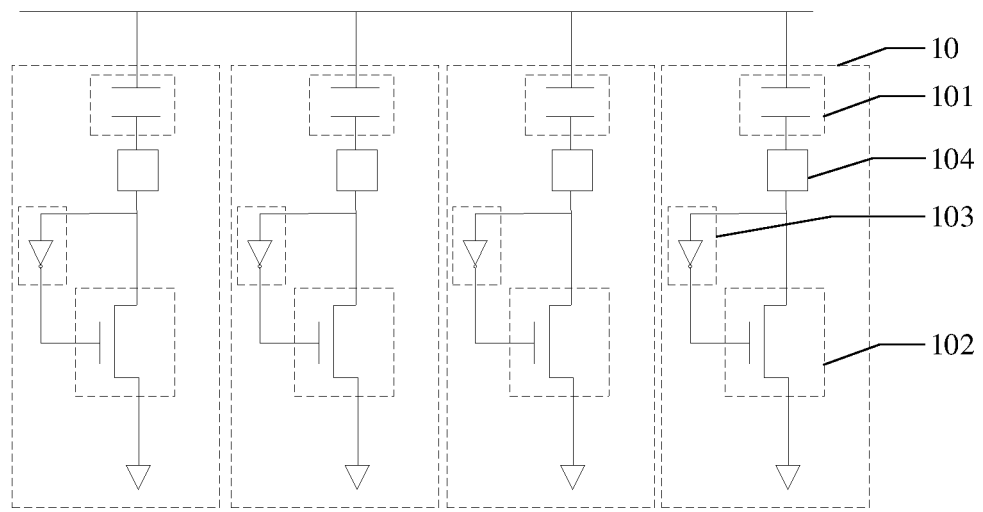
FIG. 2 is a structure diagram of a test circuit according to another embodiment of the present application.

In an optional embodiment, as shown in FIG. 2, the test circuit further comprises a number of voltage collection devices 104, and each voltage collection device 104 is electrically connected to a different test unit 10 and is electrically connected between the second terminal of the TDDB test component 101 and the drain of the NMOS transistor. In an optional embodiment, the voltage collection device 104 comprises a register. By providing a voltage collection device 104 on each test unit 10, the position of the TDDB test component 101 broken down can be determined by the abrupt voltage change collected by the voltage collection device 104 and the test unit 10 including the voltage collection device 104 that collects the abrupt voltage change. Thus, the breakdown lifetime of each TDDB test component 101 is accurately obtained.

Figure 3:
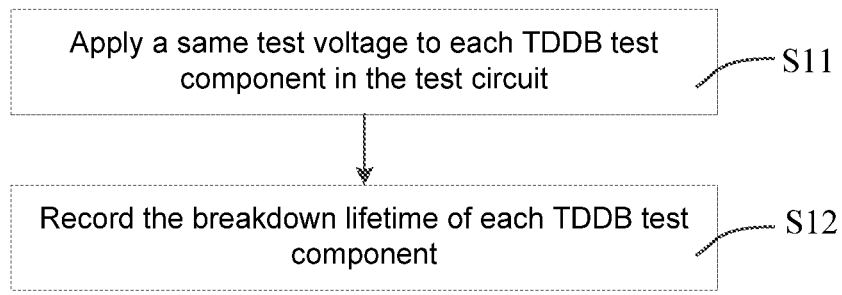
FIG. 3 is a flowchart of a semiconductor test method according to an embodiment of the present application.

As shown in FIG. 3, the present application further provides a semiconductor test method, specifically comprising:
- S11: applying a same test voltage to each TDDB test component 101 in the test circuit; and
- S12: recording the breakdown lifetime of each TDDB test component 101.

Specifically, by connecting multiple test units 10 in parallel between a same test voltage and the ground, the TDDB test components 101 in the multiple test units 10 may be tested simultaneously, and when one of the TDDB test components 101 is broken down, the subsequent testing of other TDDB test components 101 will not be affected, which greatly shortens the test time.

Figure 4:
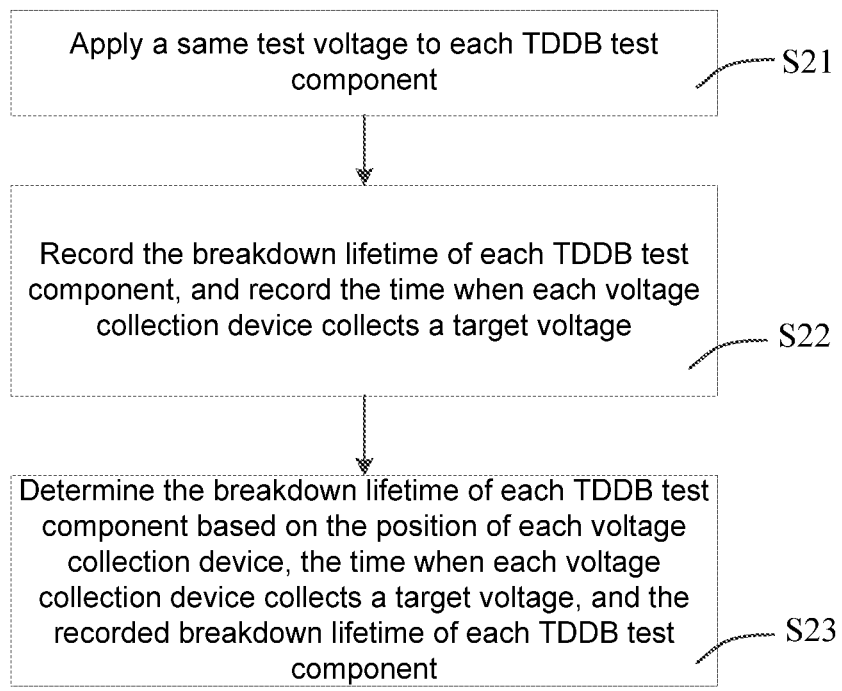
FIG. 4 is a flowchart of a semiconductor test method according to another embodiment of the present application.

As shown in FIG. 4, in other optional embodiments, the present application further provides a semiconductor test method, specifically comprising:
- S21: applying a same test voltage to each TDDB test component 101;
- S22: recording the breakdown lifetime of each TDDB test component 101, and recording the time when each voltage collection device 104 collects a target voltage; and
- S23: determining the breakdown lifetime of each TDDB test component 101 based on the position of each voltage collection device 104, the time when each voltage collection device 104 collects a target voltage, and the recorded breakdown lifetime of each TDDB test component 101.

Specifically, multiple test units 10 are connected in parallel between a same test voltage and the ground, the breakdown lifetime of each TDDB test component 101 is recorded, and when the TDDB test component 101 is broken down, the time when the voltage collection device 104 collects a target voltage is recorded. According to the time when the voltage collection device 104 collects the target voltage, the position of the voltage collection device 104, and the breakdown lifetime of the TDDB test component 101, the breakdown lifetime of the TDDB test component 101 at each position is deduced.

By the above technical solution, the TDDB test components 101 are tested at the same voltage and at the same time. Once one of the TDDB test units 10 is broken down, the control circuit and switch 102 will turn off the branch where the TDDB test unit 10 is located, to avoid the occurrence of the short-circuit, without affecting the subsequent continued testing of other TDDB test units 10. Therefore, multiple TDDB test units 10 can be tested at the same time, which greatly shortens the test time.

Various technical features of the above embodiments can be arbitrarily combined. For simplicity, not all possible combinations of various technical features of the above embodiments are described. However, all those technical features shall be included in the recorded scope of the present invention if not conflict.

The embodiments described above merely represent certain implementations of the present application. Although those embodiments are described in more specific details, it is not to be construed as any limitation to the scope of the present application. It should be noted that, for a person of ordinary skill in the art, a number of variations and improvements may be made without departing from the concept of the present application, and those variations and improvements should be regarded as falling into the protection scope of the present application. Therefore, the protection scope of the present application should be subject to the appended claims.

The invention claimed is:

1. A test circuit, comprising:
M test units, each test unit having a first terminal and a second terminal, the first terminal of each test unit being connected to a power wire, the second terminal of each test unit being connected to a ground wire, M being a positive integer;
each test unit comprises a time dependent dielectric breakdown (TDDB) test component, a switch, and a control circuit, wherein each TDDB test component has a first resistance value before being broken down, each TDDB test component has a second resistance value after being broken down, the first resistance value is greater than the second resistance value, a first terminal of each TDDB test component is the first terminal of the test unit and a second terminal of each TDDB test component is connected to a first terminal of each switch, a second terminal of each switch is the second terminal of the test unit, and the first terminal of each switch is connected to a control terminal of each switch through each control circuit.

2. The test circuit of claim 1, wherein each TDDB test component has a dielectric layer, and an area of the dielectric layer is greater than or equal to 1 $\mu m^2$ and less than or equal to 1,000,000 $\mu m^2$.

3. The test circuit of claim 2, wherein the dielectric layer of each TDDB test component of each test unit is made of silicon dioxide.

4. The test circuit of claim 3, wherein M is greater than or equal to 2, and the areas of the dielectric layers of the TDDB test components of the M test units are the same.

5. The test circuit of claim 3, wherein M is greater than or equal to 2, and the areas of the dielectric layers of the TDDB test components of the M test units are not exactly the same.

6. The test circuit of claim 5, wherein M is greater than or equal to 3, and the areas of the dielectric layers of the TDDB test components of the M test units are in an arithmetic sequence or a geometric sequence.

7. The test circuit of claim 2, wherein M is greater than or equal to 2, and the areas of the dielectric layers of the TDDB test components of the M test units are not exactly the same.

8. The test circuit of claim 2, wherein M is greater than or equal to 2, and the areas of the dielectric layers of the TDDB test components of the M test units are the same.

9. The test circuit of claim 1, wherein a ratio of the first resistance value to the second resistance value is greater than or equal to 100.

10. The test circuit of claim 1, wherein each switch comprises an n-channel metal oxide semiconductor (NMOS) transistor, a drain of the NMOS transistor is electrically connected to the second terminal of the TDDB test component, and a source of the NMOS transistor is grounded.

11. The test circuit of claim 10, wherein each control circuit comprises an inverter, an input of the inverter is electrically connected to the second terminal of the TDDB test component, and another terminal of the inverter is electrically connected to a gate of the NMOS transistor.

12. The test circuit of claim 1, further comprising a plurality of voltage collection devices, and each voltage collection device is provided in a respective test unit of the M test units and is electrically connected between the TDDB test component of the respective test unit and an n-channel metal oxide semiconductor (NMOS) transistor of the switch of the respective test unit.

13. A semiconductor test method, comprising:
   applying a same test voltage to each TDDB test component in the test circuit of claim 1; and
   recording a breakdown lifetime of each TDDB test component.

14. A semiconductor test method, comprising:
   applying a same test voltage to each TDDB test component in the test circuit of claim 12;
   recording a breakdown lifetime of each TDDB test component, and recording time when each voltage collection device collects a target voltage; and
   determining a breakdown lifetime of each TDDB test component, based on a position of each voltage collection device, the time when each voltage collection device collects the target voltage, and the recorded breakdown lifetime of each TDDB test component.

* * * * *